(12) United States Patent
Lin et al.

(10) Patent No.: US 10,607,858 B2
(45) Date of Patent: Mar. 31, 2020

(54) SEMICONDUCTOR METHOD FOR FORMING SEMICONDUCTOR STRUCTURE HAVING BUMP ON TILTING UPPER CORNER SURFACE

(71) Applicant: NANYA TECHNOLOGY CORPORATION, New Taipei (TW)

(72) Inventors: Po-Chun Lin, Changhua County (TW); Chin-Lung Chu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/183,701

(22) Filed: Nov. 7, 2018

(65) Prior Publication Data

US 2019/0074197 A1 Mar. 7, 2019

Related U.S. Application Data

(62) Division of application No. 15/598,304, filed on May 17, 2017, now Pat. No. 10,290,512.

(51) Int. Cl.
*H01L 23/00* (2006.01)
*H01L 23/31* (2006.01)
(Continued)

(52) U.S. Cl.
CPC .......... *H01L 21/56* (2013.01); *H01L 21/4853* (2013.01); *H01L 23/3114* (2013.01); *H01L 23/3171* (2013.01); *H01L 23/482* (2013.01); *H01L 24/02* (2013.01); *H01L 24/03* (2013.01); *H01L 24/04* (2013.01); *H01L 24/05* (2013.01); *H01L 24/06* (2013.01); *H01L 24/11* (2013.01); *H01L 24/12* (2013.01); *H01L 24/13* (2013.01);
*H01L 24/14* (2013.01); *H01L 24/16* (2013.01); *H01L 24/17* (2013.01); *H01L 24/81* (2013.01); *H01L 24/95* (2013.01); *H01L 25/0655* (2013.01); *H01L 25/50* (2013.01); *H01L 2224/02381* (2013.01); *H01L 2224/034* (2013.01); *H01L 2224/0311* (2013.01);
(Continued)

(58) Field of Classification Search
CPC . H01L 2224/14183; H01L 2224/16137; H01L 2224/17051; H01L 2224/16108; H01L 25/0655
See application file for complete search history.

(56) References Cited

U.S. PATENT DOCUMENTS 5,533,664 A 7/1996 Sasaki et al.
6,611,050 B1 8/2003 Ference et al.
(Continued)

FOREIGN PATENT DOCUMENTS

CN 104143557 A 11/2014
KR 10-2011-0133771 A 12/2011

*Primary Examiner* — Kevin Parendo
(74) *Attorney, Agent, or Firm* — CKC & Partners Co., LLC

(57) ABSTRACT

A semiconductor structure is provided. The semiconductor structure includes a semiconductor substrate and a first conductive bump. The semiconductor substrate has an integrated circuit and an interconnection metal layer, and a tilt surface is formed on an edge of the semiconductor substrate. The first conductive bump is electrically connected to the integrated circuit via the interconnection metal layer, and is disposed on the tilt surface, wherein a profile of the first conductive bump extends beyond a side surface of the edge of the semiconductor layer.

3 Claims, 8 Drawing Sheets

(51) Int. Cl.
*H01L 23/482* (2006.01)
*H01L 25/065* (2006.01)
*H01L 25/00* (2006.01)
*H01L 21/56* (2006.01)
*H01L 21/48* (2006.01)

(52) U.S. Cl.
CPC ............ *H01L 2224/03632* (2013.01); *H01L 2224/0401* (2013.01); *H01L 2224/04105* (2013.01); *H01L 2224/0557* (2013.01); *H01L 2224/05548* (2013.01); *H01L 2224/05558* (2013.01); *H01L 2224/05567* (2013.01); *H01L 2224/05569* (2013.01); *H01L 2224/05573* (2013.01); *H01L 2224/0605* (2013.01); *H01L 2224/06102* (2013.01); *H01L 2224/06179* (2013.01); *H01L 2224/06183* (2013.01); *H01L 2224/06515* (2013.01); *H01L 2224/113* (2013.01); *H01L 2224/11849* (2013.01); *H01L 2224/12105* (2013.01); *H01L 2224/13023* (2013.01); *H01L 2224/13024* (2013.01); *H01L 2224/13111* (2013.01); *H01L 2224/1403* (2013.01); *H01L 2224/14179* (2013.01); *H01L 2224/14183* (2013.01); *H01L 2224/14515* (2013.01); *H01L 2224/16013* (2013.01); *H01L 2224/16058* (2013.01); *H01L 2224/16059* (2013.01); *H01L 2224/16137* (2013.01); *H01L 2224/16141* (2013.01); *H01L 2224/17051* (2013.01); *H01L 2224/1751* (2013.01); *H01L 2224/17152* (2013.01); *H01L 2224/17179* (2013.01); *H01L 2224/17183* (2013.01); *H01L 2225/065* (2013.01)

(56) References Cited

U.S. PATENT DOCUMENTS

| | | |
|---|---|---|
| 6,927,491 B1 | 8/2005 | Yamada |
| 7,504,722 B2 | 3/2009 | Ochiai |
| 2006/0170734 A1 | 8/2006 | Ibe et al. |
| 2010/0301475 A1 | 12/2010 | Hsu et al. |
| 2012/0013019 A1 | 1/2012 | Sakamoto et al. |
| 2014/0070380 A1 | 3/2014 | Chiu et al. |
| 2014/0326856 A1 | 11/2014 | Massetti |
| 2016/0126329 A1* | 5/2016 | Vellaisamy ......... H01L 29/0673 257/325 |

* cited by examiner

SEMICONDUCTOR METHOD FOR FORMING SEMICONDUCTOR STRUCTURE HAVING BUMP ON TILTING UPPER CORNER SURFACE

CROSS-REFERENCE TO RELATED APPLICATION

The present application is a Divisional application of the U.S. application Ser. No. 15/598,304, filed May 17, 2017, which is herein incorporated by reference in its entirety.

BACKGROUND

Technical Field

The present disclosure relates to a semiconductor structure and a semiconductor device and a method for forming the same.

Description of Related Art

With semiconductor packaging techniques being rapidly developed, semiconductor products are more and more compactly integrated, and provide better performance with greater miniaturization. Consequently, various methods for forming semiconductor packages, such as wire bonding, flip chip, and wafer level packaging, are developed to meet various requirements. However, conventional structures and fabrication methods of the semiconductor packages, apparently have inconvenience and defects, and need further improvement. For example, in the method of wafer level packaging, die bonding with bumps only links a semiconductor element to an object stacked vertically, and a redistribution layer build-up is needed for connecting the semiconductor element to the object laterally thus increasing the cost of fabricating the semiconductor packages.

To deal with the foregoing problems, those skilled in the art have striven to attain a solution, but still lack a suitable solution to overcome the problems. Therefore, how to deal with the foregoing problems effectively is an important topic of research and development, and is also a desired improvement in the art.

SUMMARY

A semiconductor structure provided in the present disclosure is capable of connecting a semiconductor element to another object side by side.

The semiconductor device provided in the present disclosure is capable of establishing lateral communications with conductive bumps for cost-saving.

A method for forming a semiconductor device provided in the present disclosure adopts an operation of forming a conductive bump on an edge of a semiconductor structure to establish lateral communications for cost-saving.

The present disclosure provides a semiconductor structure. The semiconductor structure includes a semiconductor substrate and a first conductive bump. The semiconductor substrate has an integrated circuit and an interconnection metal layer, and a tilt surface is formed on an edge of the semiconductor substrate. The first conductive bump is electrically connected to the integrated circuit via the interconnection metal layer, and is disposed on the tilt surface, wherein a profile of the first conductive bump extends beyond a side surface of the edge of the semiconductor substrate.

The present disclosure provides a semiconductor device. The semiconductor device includes two semiconductor structures which are laterally connected with each other, and each of the semiconductor structures includes a semiconductor substrate and a first conductive bump. The semiconductor substrate has an integrated circuit and an interconnection metal layer, and a tilt surface is formed on an edge of the semiconductor substrate. The first conductive bump is electrically connected to the integrated circuit via the interconnection metal layer, and is disposed on the tilt surface, in which a profile of the first conductive bump extends beyond a side surface of the edge. The two semiconductor structures are laterally connected by their respective first conductive bumps which are jointed.

The present disclosure provides a method for forming a semiconductor device. The method includes the steps as following. A tilt surface is formed on an edge of each of the at least one semiconductor substrate having an integrated circuit and an interconnection metal layer. A first conductive bump is formed on the tilt surface, in which the first conductive bump is electrically connected to the integrated circuit via the interconnection metal layer, and a profile of the first conductive bump extends beyond a side surface of the edge.

In one or more embodiments, the semiconductor substrate further includes a substrate, a passivation layer, a first conductor layer and a second conductor layer. The passivation layer is disposed on the substrate. The first conductor layer is disposed on the passivation layer. The second conductor layer is disposed on the passivation layer and the first conductor layer, in which the second conductor layer is electrically connected to the first conductor layer.

In one or more embodiments, the substrate has an inclined plane. A portion of the first conductor layer has a first portion and a second portion. The first portion is disposed on the inclined plane of the substrate, and the second portion is disposed on a horizontal upper surface of the substrate. An upper surface of the first portion of the first conductor layer is the tilt surface.

In one or more embodiments, the passivation layer includes a redistribution layer.

In one or more embodiments, the semiconductor structure further includes second conductive bumps which are disposed on an upper surface of the semiconductor substrate, and are electrically connected to the second conductor layer.

In one or more embodiments, a maximum vertical height of each of the second conductive bumps is greater than a maximum vertical height of the first conductive bump.

In one or more embodiments, the semiconductor structure further includes a printed circuit board having solder pads which are in contact with the second conductive bumps without contacting the first conductive bump.

In one or more embodiments, the method for forming a semiconductor device further comprises a step as following. The at least one semiconductor substrate are two semiconductor substrates and the first conductive bumps on the tilt surfaces of the two semiconductor substrates are jointed so as to connect the two semiconductor structures laterally.

In one or more embodiments, forming the tilt surface on the edge of the at least one semiconductor substrate comprises the steps as following. A substrate is provided. A passivation layer is formed on the substrate. An inclined plane is formed on an edge of the substrate. A metal layer is formed on the passivation layer. The metal layer is patterned to form a first conductor layer on the passivation layer, wherein an upper surface of part of the first conductor layer on the edge of the substrate is the tilt surface. A second conductor layer is formed on the passivation layer and the first conductor layer, wherein the second conductor layer is electrically connected to the first conductor layer. The first conductive bump is formed on the tilt surface.

In one or more embodiments, the method for forming a semiconductor device further comprises a step as following. A plurality of second conductive bumps is formed on a horizontal upper surface of the semiconductor substrate, wherein the second conductive bumps are electrically connected to the second conductor layer.

In one or more embodiments, the method for forming a semiconductor device further comprises steps as following. A printed circuit board having a plurality of solder pads is provided. The solder pads are electrically connected to the second conductive bumps, wherein the solder pads are in contact with the second conductive bumps but do not contact the first conductive bump.

By using the configuration of the first conductive bump on the tilt surface, the semiconductor structure is capable of connecting the semiconductor element to another object side by side. For example, when a semiconductor device includes two aforementioned semiconductor structures, and the tilt surfaces of the two semiconductor substrates face toward each other, the first conductive bumps on the tilt surfaces of the two semiconductor substrates may be jointed so as to connect the two semiconductor structures laterally. In this way, the two semiconductor structures are laterally connected by their respective first conductive bumps being jointed, and therefore, there is no need of redistribution layer build-up to connect the semiconductor element to another object laterally. Therefore, the semiconductor device is capable of laterally communicating with conductive bumps, thus achieving cost-saving.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
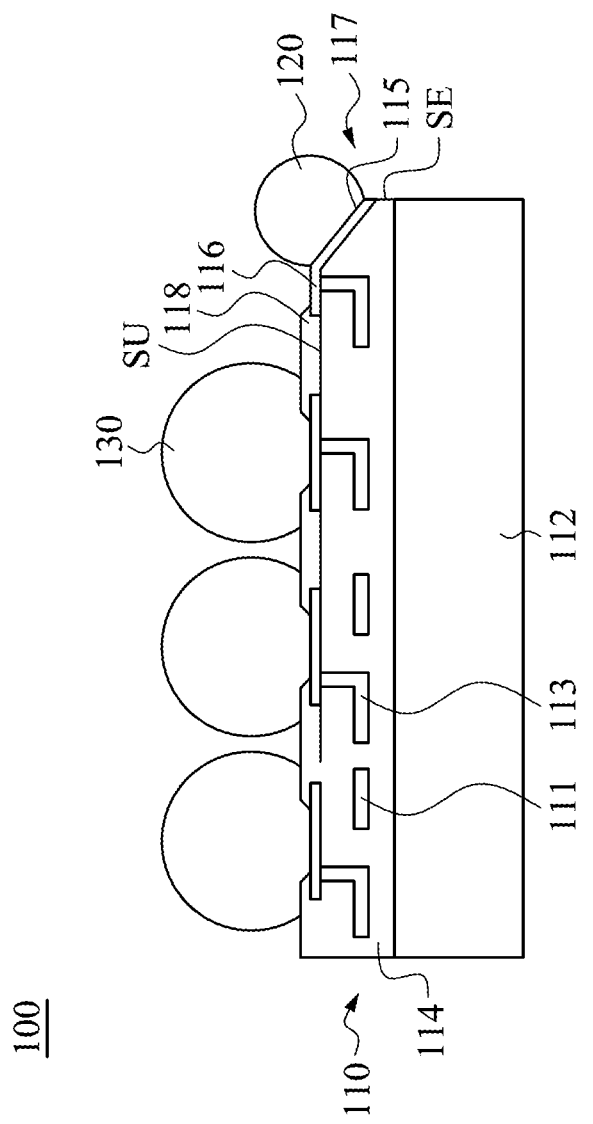
FIG. 1 is a schematic cross-sectional view of a semiconductor structure according to one embodiment of this disclosure.

Referring to FIG. 1, FIG. 1 is a schematic cross-sectional view of a semiconductor structure 100 according to one embodiment of this disclosure. A semiconductor structure 100 includes a semiconductor substrate 110, a first conductive bump 120, and second conductive bumps 130. In the present embodiment, the first conductive bump 120 and the second conductive bumps 130 are formed from solder, tin-lead or other suitable materials, but the present disclosure is not be limited thereto. For example, in various embodiments, the first conductive bump 120 and the second conductive bumps 130 may include a solder bump or paste that may be mounted or printed onto a top surface SU of the semiconductor substrate 110.

As shown in FIG. 1, the semiconductor substrate 110 has an integrated circuit 111 and an interconnection metal layer 113, and further includes a substrate 112, a passivation layer 114, a first conductor layer 116 and a second conductor layer 118. The passivation layer 114 is disposed on the substrate 112. The first conductor layer 116 is disposed on the passivation layer 114. The second conductor layer 118 is disposed on the passivation layer 114 and the first conductor layer 116, in which the second conductor layer 118 is electrically connected to the first conductor layer 116.

Moreover, as shown in FIG. 1, a tilt surface 115 is formed on an edge 117 of the semiconductor substrate 110. The first conductive bump 120 is electrically connected to the integrated circuit 111 via the interconnection metal layer 113, and is disposed on the tilt surface 115, in which a profile of the first conductive bump 120 extends beyond a side surface SE of the edge 117. The second conductive bumps 130 are disposed on an upper surface SU of the semiconductor substrate 110, and are electrically connected to the second conductor layer 118.

The process of forming the semiconductor structure 100 will be further explained below with reference to FIG. 2A to FIG. 2F.

Figure 2A:
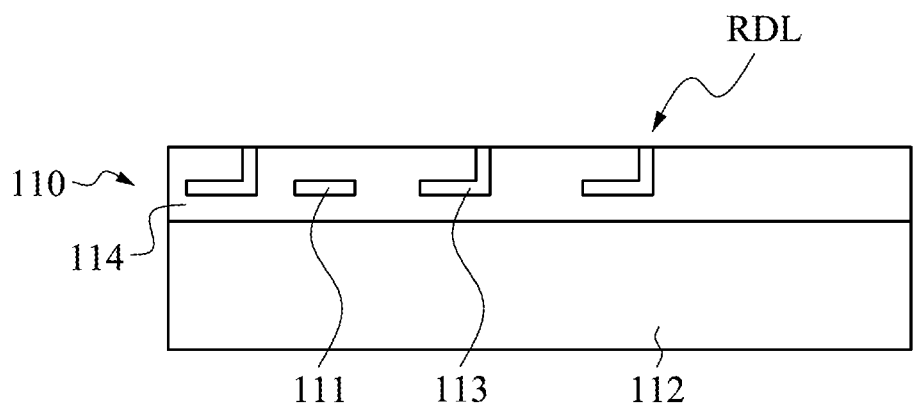
FIGS. 2A-2F are cross-sectional views of various fabrication steps of a method of forming a semiconductor structure according to one embodiment of this disclosure.

FIGS. 2A-2F are cross-sectional views of various fabrication steps of a method forming a semiconductor structure 100 according to one embodiment of this disclosure. Referring to FIG. 2A, a substrate 112 is provided, and a passivation layer 114 is formed on the substrate 112. In the present embodiment, the semiconductor substrate 110 has an integrated circuit 111 and an interconnection metal layer 113. For example, as shown in FIG. 2A, the passivation layer 114 further includes a redistribution layer RDL which may be connected to the integrated circuit 111 inside the semiconductor substrate 110.

Figure 2B:
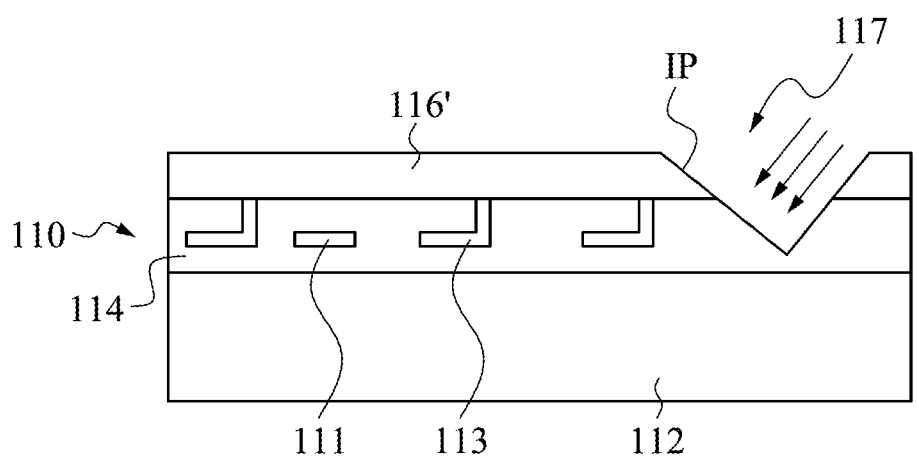

Referring to FIG. 2B, a metal layer 116' is formed on the passivation layer 114, and an inclined plane IP is formed on an edge 117 of the substrate 112. For example, the method of forming the inclined plane IP includes drilling the substrate 112 by using a laser at an inclined angle in the present embodiment. Then, the substrate 112 is cut to keep the part of the inclined plane IP on the edge 117. In this way, the inclined plane IP on the edge 117 of the substrate 112 is formed.

Figure 2C:
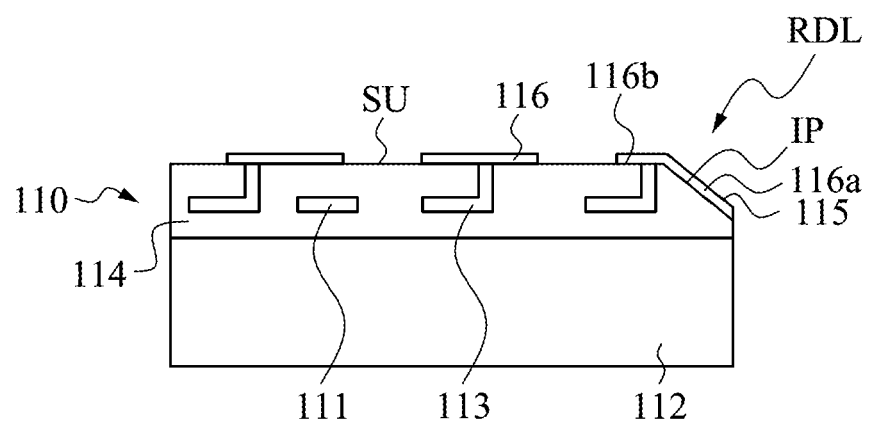

Referring to FIG. 2C, the metal layer 116' is patterned to form a first conductor layer 116 on the passivation layer 114. As shown in FIG. 2C, in the present embodiment, an upper surface of a portion of the first conductor layer 116 on the edge 117 of the substrate 112 is the tilt surface 115. In more detail, in the present embodiment, a portion of the first conductor layer 116 has a first portion 116a and a second portion 116b. The first portion 116a is disposed on the inclined plane IP of the substrate 112, and the second portion 116b is disposed on a horizontal upper surface SU of the substrate 112. The upper surface of the first portion 116a of the first conductor layer 116 is the tilt surface 115.

Figure 2D:
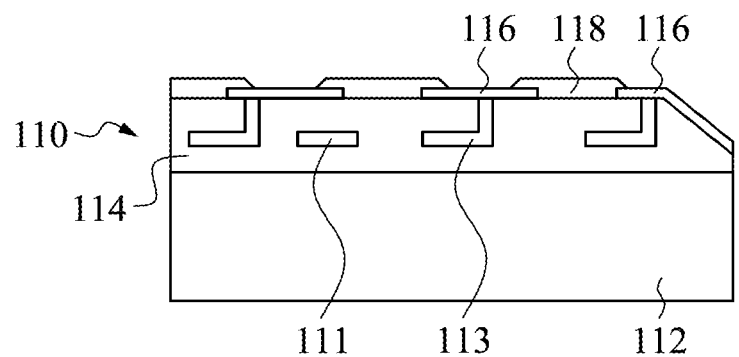

Referring to FIG. 2D, a second conductor layer 118 is formed on the passivation layer 114 and the first conductor layer 116. As shown in FIG. 2D, in the present embodiment, the second conductor layer 118 is electrically connected to the first conductor layer 116. More specifically, in the present embodiment, portions of the first conductor layer 116 may be connected through the second conductor layer 118. However, the present disclosure is not limited thereto. Alternatively, portions of the first conductor layer 116 may be not connected, and are separated spatially in another embodiment.

Figure 2E:
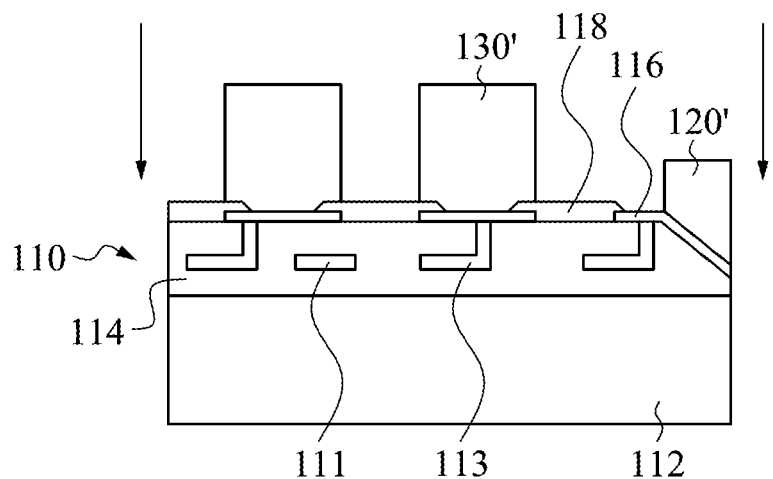

Referring to FIG. 2E, conductive materials 120' and 130' may be formed on the first conductor layer 116 and the second conductor layer 118. In the present embodiment, the conductive materials 120' and 130' may be printed or deposited on the first conductor layer 116 and the second conductor layer 118 using a print mask (not shown) to align the conductive materials 120' and 130' to the first conductor layer 116 and the second conductor layer 118.

Figure 2F:
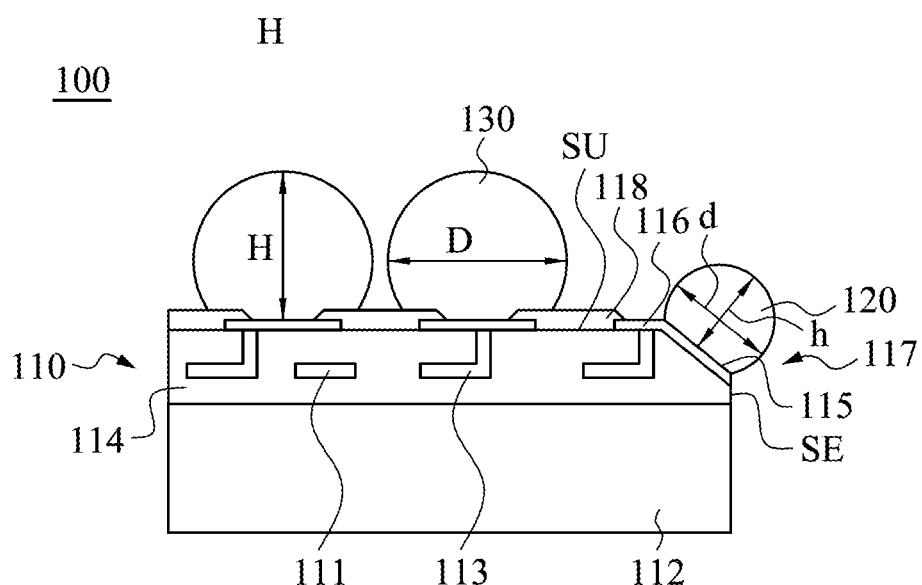

Referring to FIGS. 2E and 2F, a reflow process may be performed to reflow the conductive materials 120' and 130' of FIG. 2E to form the first conductive bump 120 and the second conductive bumps 130 for the semiconductor structure 100. As a result, the first conductive bump 120 is formed on the tilt surface 115, and a profile of the first conductive bump 120 extends beyond a side surface SE of the edge 117, as shown in FIG. 2F. Besides, the first conductive bump 120 is electrically connected to the integrated circuit 111 via the interconnection metal layer 113. Moreover, as shown in FIG. 2F, the second conductive bumps 130 is also formed on a horizontal upper surface SU of the semiconductor substrate 110 at the same time, in which the second conductive bumps 130 are electrically connected to the second conductor layer 118.

In more detail, as shown in FIG. 2F, a maximum vertical height H of each of the second conductive bumps 130 is greater than a maximum vertical height h of the first conductive bump 120. For example, in the present embodiment, a diameter D of each of the second conductive bumps 130 is greater than a diameter d of the first conductive bump 120, such that the maximum vertical height H of each of the second conductive bumps 130 is greater than a maximum vertical height h of the first conductive bump 120. However, the present disclosure is not limited thereto. For example, in various embodiments, the diameter D of each of the second conductive bumps 130 may be equal to or greater than the diameter d of the first conductive bump 120, thus also resulting in the maximum vertical height H of each of the second conductive bumps 130 being greater than a maximum vertical height h of the first conductive bump 120 since the first conductive bump 120 is on the tilt surface 115.

As a result, the semiconductor structure 100 is formed. Furthermore, in the present embodiment, by using the configuration of the first conductive bump 120 on the tilt surface 115, the semiconductor structure 100 is capable of connecting the semiconductor element to another object side by side. Hereinafter, further explanations are provided in the below with reference to FIG. 3.

Figure 3:
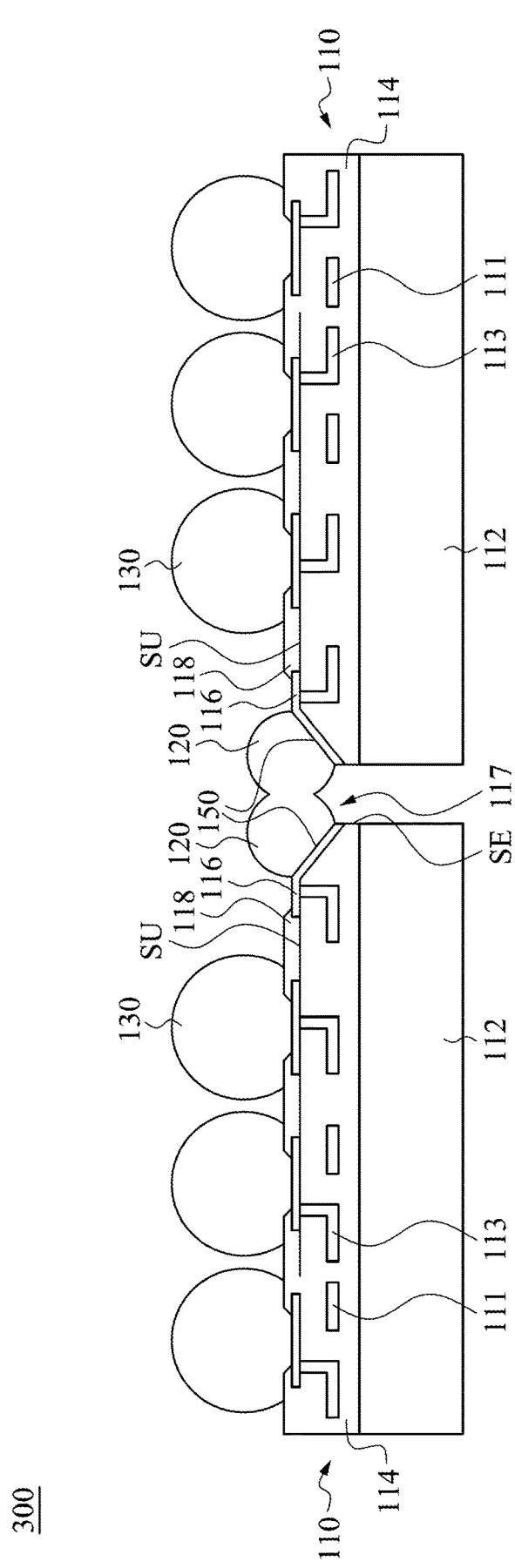
FIG. 3 is a schematic cross-sectional view of a semiconductor device according to one embodiment of this disclosure.

Referring to FIG. 3, FIG. 3 is a schematic cross-sectional view of a semiconductor device 300 according to one embodiment of this disclosure. The semiconductor device 300 includes two aforementioned semiconductor structures 100, and the tilt surfaces 115 of the two semiconductor substrates 100 face toward each other. By using this configuration, the first conductive bumps 120 on the tilt surfaces 115 of the two semiconductor substrates 110 may be jointed so as to connect the two semiconductor structures 100 laterally. In this way, the two semiconductor structures 100 are laterally connected by their respective first conductive bumps 120 that are jointed, and therefore, no redistribution layer build-up is needed to connect the semiconductor element to another object laterally. That is, in the present embodiment, the semiconductor device 300 is capable of laterally communicating with conductive bumps, thus achieving cost-saving.

Figure 4:
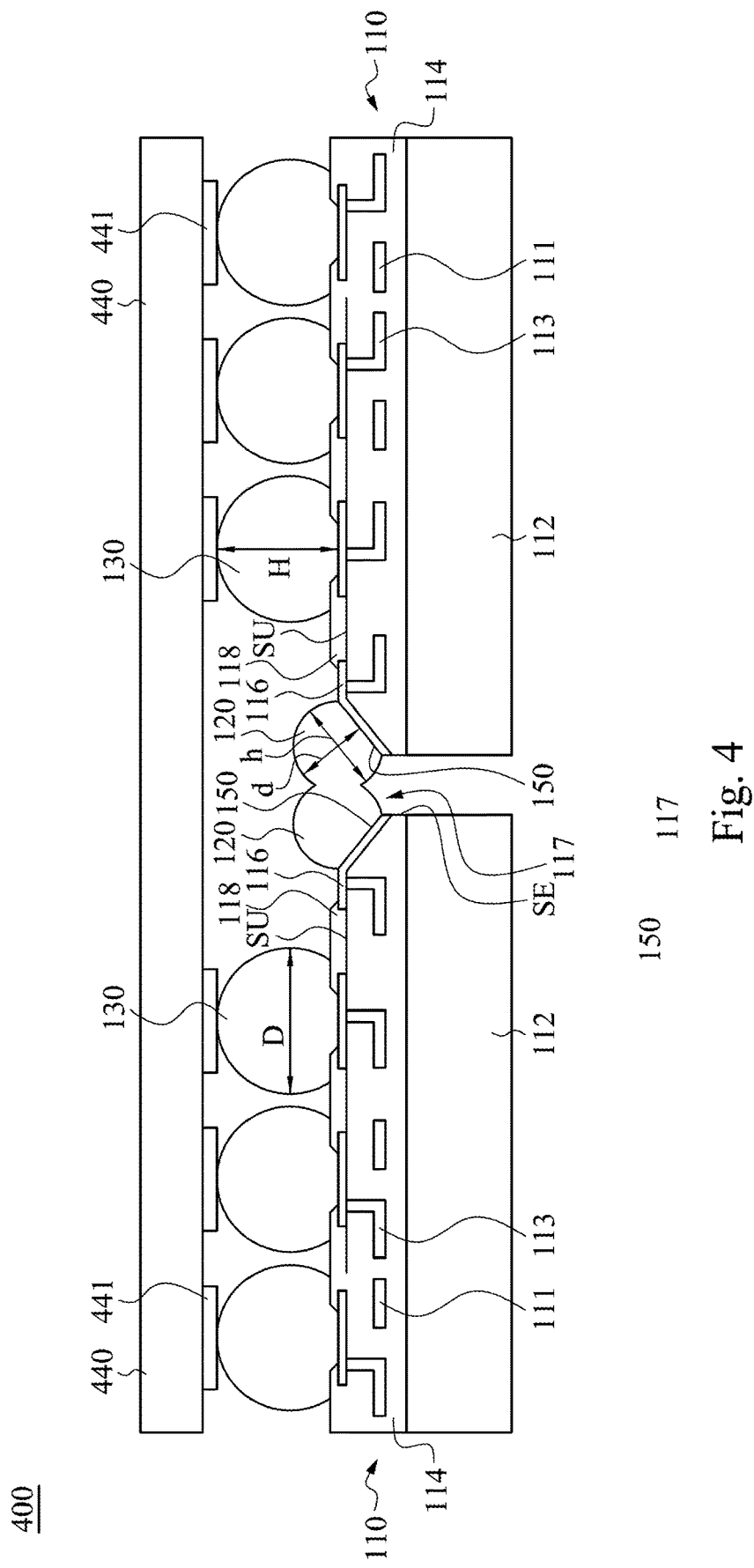
FIG. 4 is a schematic cross-sectional view of a semiconductor device according to another embodiment of this disclosure.

Referring to FIG. 4, FIG. 4 is a schematic cross-sectional view of a semiconductor device 400 according to another embodiment of this disclosure. The semiconductor device 400 is similar to the semiconductor device 300, but the semiconductor device 400 further includes a printed circuit board 440. In more detail, the printed circuit board 440 has solder pads 441. The solder pads 441 are electrically connected to the second conductive bumps 130, and the solder pads 441 are in contact with the second conductive bumps 130. Since the maximum vertical height H of each of the second conductive bumps 130 is greater than a maximum vertical height h of the first conductive bump 120, the solder pads 441 do not contact the first conductive bump 120.

In this way, the two semiconductor structures 100 are laterally connected by their respective first conductive bumps 120 that are jointed, and therefore, no redistribution layer is needed to be built-up in the printed circuit board 440 to connect the semiconductor element to another object laterally. That is, in the present embodiment, the semiconductor device 400 is capable of laterally communicating with conductive bumps for cost-saving.

Figure 5A:
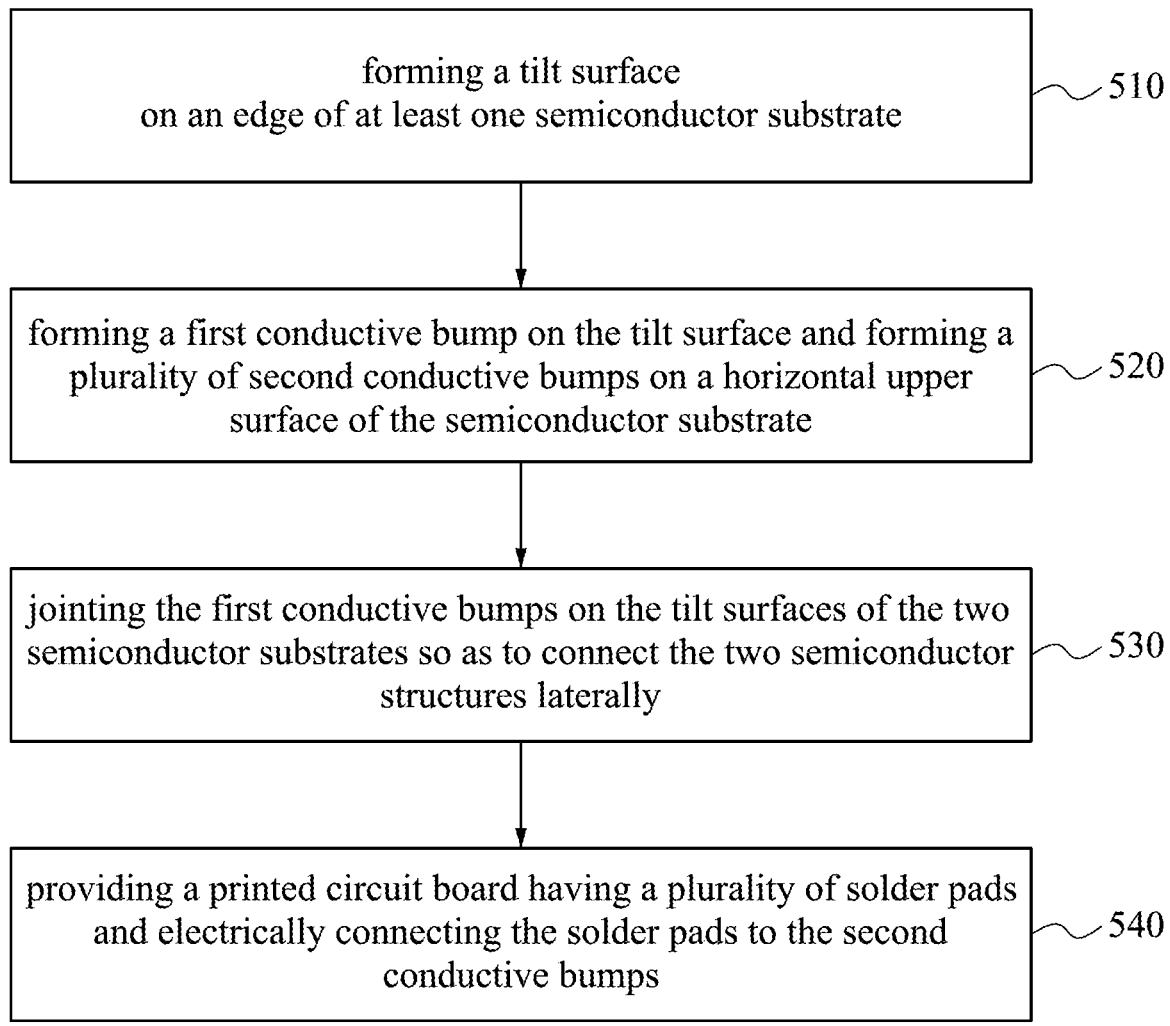
FIGS. 5A-5B are flow charts illustrating various fabrication steps of a method of forming a semiconductor device according to one embodiment of this disclosure.
Figure 5B:
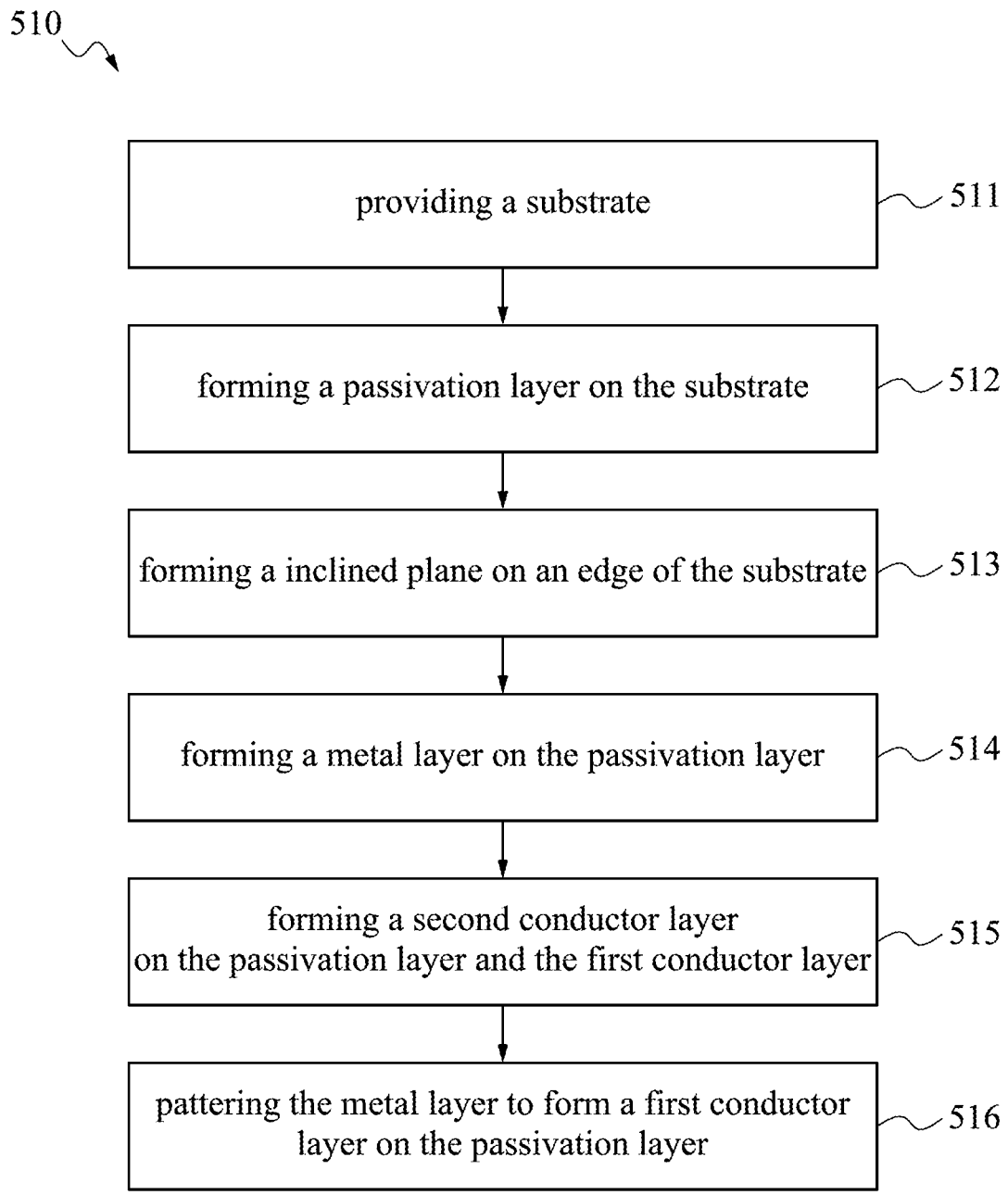

FIGS. 5A-5B are flow charts illustrating various fabrication steps of a method of forming a semiconductor device, according to one embodiment of this disclosure. Referring to FIG. 5A, in the method of forming a semiconductor device, step 510 is performed for forming a tilt surface on an edge of at least one semiconductor substrate having an integrated circuit and an interconnection metal layer. More specifically, referring to FIG. 5B, step 510 of forming the tilt surface on the edge includes steps 511, 512, 513, 514, 515 and 516 as follows.

As shown in FIG. 5B, in the present embodiment, in step 510, step 511 is performed for providing a substrate. Then, step 512 is performed for forming a passivation layer on the substrate. Thereafter, step 513 is performed forming an inclined plane on an edge of the substrate. Then, step 514 is performed for forming a metal layer on the passivation layer. Thereafter, step 510 515 is performed for forming a second conductor layer on the passivation layer and the first conductor layer. Then, step 516 is performed for patterning the metal layer to form a first conductor layer on the passivation layer Referring to FIG. 5A again, the method of forming a semiconductor device further includes step 520 of forming a first conductive bump on the tilt surface and forming second conductive bumps on a horizontal upper surface of the semiconductor substrate. Then, step 530 is performed for jointing the first conductive bumps on the tilt surfaces of the two semiconductor substrates so as to connect the two semiconductor structures laterally. Alternatively, the method of forming a semiconductor device may further includes step 540 of providing a printed circuit board with solder pads, and electrically connecting the solder pads to the second conductive bumps.

As mentioned above, by using the configuration of the first conductive bump on the tilt surface, the semiconductor structure is capable of connecting the semiconductor element to another object side by side. For example, when a semiconductor device includes two aforementioned semiconductor structures, and the tilt surfaces of the two semiconductor substrates face toward each other, and the first conductive bumps on the tilt surfaces of the two semiconductor substrates may be jointed so as to connect the two semiconductor structures laterally. In this way, the two semiconductor structures are laterally connected by their respective first conductive bumps being jointed, and therefore, there is no need of redistribution layer build-up to connect the semiconductor element to another object laterally. Therefore, the semiconductor device is capable of laterally communicating with conductive bumps, thus achieving cost-saving.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A method for forming a semiconductor device, the method comprising:

forming a tilt surface on an edge of at least one semiconductor substrate having an integrated circuit and an interconnection metal layer;

forming a first conductive bump in direct contact with the tilt surface, wherein the first conductive bump is electrically connected to the integrated circuit via the interconnection metal layer, and a profile of the first conductive bump extends beyond a side surface of the edge;

forming a plurality of second conductive bumps in direct contact with an upper surface of the semiconductor substrate, each of the second conductive bumps has a cross-sectional area greater than a cross-sectional area of the first conductive bump; and providing a printed circuit board having a plurality of solder pads which are in contact with and electrically connected to the second conductive bumps, without contacting the first conductive bump, wherein both the tilt surface and the upper surface of the semiconductor substrate face toward the printed circuit board.

2. The method for forming a semiconductor device of claim 1, wherein the at least one semiconductor substrate includes two semiconductor substrates, the method further comprising:

jointing the first conductive bumps of the two semiconductor substrates.

3. The method for forming a semiconductor device of claim 1, wherein forming the tilt surface on the edge of the at least one semiconductor substrate comprises:

providing a substrate;

forming a passivation layer on the substrate;

forming an inclined plane on an edge of the substrate;

forming a metal layer on the passivation layer;

patterning the metal layer to form a first conductor layer on the passivation layer, wherein an upper surface of a portion of the first conductor layer on the edge of the substrate is the tilt surface;

forming a second conductor layer on the passivation layer and the first conductor layer, wherein the second conductor layer is electrically connected to the first conductor layer; and forming the first conductive bump on the tilt surface.

* * * * *